(12) United States Patent
Shi et al.

(10) Patent No.: US 12,010,894 B2
(45) Date of Patent: Jun. 11, 2024

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventors: Tengteng Shi, Hubei (CN); Zhuo Zhang, Hubei (CN); Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 855 days.

(21) Appl. No.: 16/979,686

(22) PCT Filed: Jul. 9, 2020

(86) PCT No.: PCT/CN2020/101002
§ 371 (c)(1),
(2) Date: Sep. 10, 2020

(87) PCT Pub. No.: WO2021/253529
PCT Pub. Date: Dec. 23, 2021

(65) Prior Publication Data
US 2022/0302223 A1    Sep. 22, 2022

(30) Foreign Application Priority Data
Jun. 16, 2020 (CN) .......................... 202010547580.1

(51) Int. Cl.
*H10K 59/60* (2023.01)
*G02F 1/133* (2006.01)
(Continued)

(52) U.S. Cl.
CPC ......... *H10K 59/60* (2023.02); *G02F 1/13312* (2021.01); *G02F 1/133512* (2013.01);
(Continued)

(58) Field of Classification Search
CPC ...... H10K 59/60; H10K 50/865; H10K 59/38; H10K 59/65; G02F 1/13312;
(Continued)

(56) References Cited

U.S. PATENT DOCUMENTS 5,747,967 A * 5/1998 Muljadi .............. H01M 10/465
320/155
2009/0002341 A1    1/2009 Saito et al.
(Continued)

FOREIGN PATENT DOCUMENTS

CN    103236435 A    8/2013
CN    105467638 A    4/2016
(Continued)

*Primary Examiner* — Antonio Xavier
(74) *Attorney, Agent, or Firm* — PV IP PC; Wei Te Chung; Zhigang Ma

(57) ABSTRACT

The present application provides a display panel and a display device. The display panel includes pixel units spaced apart from each other and at least one photosensor. From a top view, each photosensor is arranged at one side of the corresponding pixel unit, and the photosensors are configured to convert received light energy into electrical energy, so that the display panel has long-lasting power.

17 Claims, 9 Drawing Sheets

(51) Int. Cl.
  *G02F 1/1335* (2006.01)
  *G06V 40/13* (2022.01)
  *G09G 3/20* (2006.01)
  *H10K 50/86* (2023.01)
  *H10K 59/38* (2023.01)
(52) U.S. Cl.
  CPC .... *G02F 1/133514* (2013.01); *G06V 40/1318* (2022.01); *G09G 3/20* (2013.01); *H10K 50/865* (2023.02); *H10K 59/38* (2023.02); *G09G 2354/00* (2013.01); *G09G 2360/144* (2013.01)
(58) Field of Classification Search
  CPC ......... G02F 1/133512; G02F 1/133514; G02F 1/13338; G02F 1/133562; G02F 1/1333; G06V 40/1318; G09G 3/20; G09G 2354/00; G09G 2360/144; H02J 7/35
  See application file for complete search history.

(56) References Cited

U.S. PATENT DOCUMENTS

| | | |
|---|---|---|
| 2011/0057908 A1 | 3/2011 | Park et al. |
| 2015/0318506 A1 | 11/2015 | Zhou et al. |
| 2019/0377924 A1* | 12/2019 | Shen ...................... G06V 40/13 |
| 2020/0042766 A1* | 2/2020 | Yang ................... H01L 27/1443 |
| 2020/0110469 A1* | 4/2020 | Li ............................ G06F 3/017 |
| 2020/0183211 A1* | 6/2020 | Weng ................ G02F 1/133605 |
| 2020/0293738 A1* | 9/2020 | Zhang ................ G06V 40/1318 |
| 2020/0302255 A1* | 9/2020 | Amin ............... G06Q 20/40145 |
| 2021/0150178 A1* | 5/2021 | Wang ................ G06V 40/1388 |

FOREIGN PATENT DOCUMENTS

| | | |
|---|---|---|
| CN | 106094320 A | 11/2016 |
| CN | 206060339 U | 3/2017 |
| CN | 107436458 A | 12/2017 |
| CN | 109031824 A | 12/2018 |
| CN | 109411521 A | 3/2019 |
| CN | 109521605 A | 3/2019 |
| CN | 109767714 A | 5/2019 |
| CN | 109904189 A | 6/2019 |
| CN | 109950235 A | 6/2019 |
| CN | 110045536 A | 7/2019 |
| CN | 110989870 A | 4/2020 |
| CN | 211555891 U | 9/2020 |
| JP | 2008305154 A | 12/2008 |
| JP | 2014120629 A | 6/2014 |

* cited by examiner

DISPLAY PANEL AND DISPLAY DEVICE

FIELD OF DISCLOSURE

The present application relates to a field of display technology and in particular, to a display panel and a display device.

DESCRIPTION OF RELATED ART

With the development of display technology, there has been a trend towards display devices having a full screen and versatile functions. However, the larger a display screen of the display device, the greater the power consumption of the display screen. Besides, not all the light energy generated from the consumed power can be used in display operations. Some of the light energy is lost in the display device, causing a waste of energy.

SUMMARY

The present application provides a display panel and a display device to achieve energy saving and provides a longer-lasting power for the display panel.

The present application provides a display panel, comprising:
  a plurality of pixel units spaced apart from each other; and
  at least one photosensor, wherein from a top view, each of the photosensors is arranged at one side of the corresponding pixel unit, and the photosensors are configured to convert received light energy into electrical energy.

In the display panel, the photosensor comprises a first state and a second state; when the photosensor is in the first state, the photosensor is configured to convert the received light energy into the electrical energy; when the photosensor is in the second state, the photosensor is configured to receive reflected light of a fingerprint to generate an electrical signal; and the display panel further comprises a signal reading circuit, and the signal reading circuit is configured to identify the fingerprint according to the electrical signal.

In the display panel, the display panel further comprises an array substrate, each of the pixel units comprises a plurality of light-emitting elements arranged on the array substrate, and from a top view, each of the photosensors is arranged between two adjacent light-emitting elements.

In the display panel, the light-emitting element comprises at least one of an organic light-emitting diode, a mini light-emitting diode, and a micro light-emitting diode.

In the display panel, the display panel further comprises a plurality of color filter units spaced apart from each other, and from a top view, the photosensors are arranged between the color filter units.

In the display panel, the display panel further comprises a black matrix; from a top view, the black matrix is arranged between the color filter units; and the photosensors face toward the black matrix.

In the display panel, the black matrix is disposed over the color filter unit, or the black matrix is arranged in gaps between the color filter units, or the black matrix is arranged below the color filter units.

In the display panel, the photosensors are arranged under the black matrix, and a plurality of via holes are defined in the black matrix to expose the photosensors.

In the display panel, the display panel further comprises an array substrate, and the photosensors are arranged in areas of the array substrate corresponding to the black matrix.

In the display panel, the pixel units are liquid crystal display units, the display panel further comprises a color filter substrate, the color filter units spaced apart from each other are disposed on the color filter substrate, and each of the pixel units comprises a corresponding one of the color filter units.

In the display panel, the display panel further comprises an array substrate, each of the pixel units comprises a plurality of light-emitting elements arranged on the array substrate, and the color filter units are disposed corresponding to the light-emitting elements.

In the display panel, the photosensor comprises an element for producing a photoelectric effect or a photovoltaic effect.

In the display panel, the photosensor comprises at least one of a photodiode, a phototransistor, and a photocell.

In the display panel, the display panel further comprises an electrical energy collection circuit electrically connected to at least one of the photosensors for storing the electrical energy.

In the display panel, the electrical energy collection circuit further comprises:
  a charging chip electrically connected to the photosensor; and
  an energy storage device, wherein the photosensor charges the energy storage device through the charging chip.

In the display panel, the electrical energy collection circuit further comprises a boost circuit arranged between the photosensors and the charging chip.

In the display panel, the boost circuit comprises at least one capacitor and an inductor, the photosensors are connected in parallel with the at least one capacitor, one end of the inductor is connected to the at least one capacitor, and the other end of the inductor is electrically connected to the charging chip.

In the display panel, the signal reading circuit further comprises:
  a plurality of reading circuits configured to read the electrical signal; and
  a reading chip electrically connected to the reading circuits, wherein the reading chips are configured to identify the fingerprint according to a difference between the electrical signals.

In the display panel, each of the reading circuits further comprises:
  a storage capacitor, wherein the storage capacitor is connected in parallel with the photosensor, and a first terminal of the storage capacitor is configured to receive a bias signal; and
  a transistor, wherein a gate of the transistor is connected to a scan signal line, a first terminal of the transistor is connected to a reading signal line, and a second terminal of the transistor is connected to a second terminal of the storage capacitor.

The present application further provides a display device. The display device comprises a display panel, wherein the display panel comprises:
  a plurality of pixel units spaced apart from each other; and
  at least one photosensor, wherein from a top view, each of the photosensors is arranged at one side of the corresponding pixel unit, and the photosensors are configured to convert received light energy into electrical energy.

Compared with conventional techniques, the display panel and the display device of the present application comprise: a plurality of pixel units spaced apart from each other and at least one photosensor. From a top view, each photosensor is located at one side of the corresponding pixel unit. The photosensor is configured to convert the received light energy into electrical energy, thus achieving energy saving and providing longer-lasting power for the display panel.

BRIEF DESCRIPTION OF DRAWINGS

A detailed description is provided below with reference to the accompanying drawings for ease of understanding of the technical solutions and specific embodiments of the present application. The accompanying drawings and their descriptions, as part of this specification, are only used to explain the technical solutions of the present application, and do not constitute a limitation to the application.

DETAILED DESCRIPTION OF EMBODIMENTS

In order to better describe the purpose, technical solutions, and effects of the present application, a description is provided below with reference to the accompanying drawings and embodiments. It should be understood that the specific embodiments described here are only used to explain the present application, and not used to limit the present application.

Figure 1A:
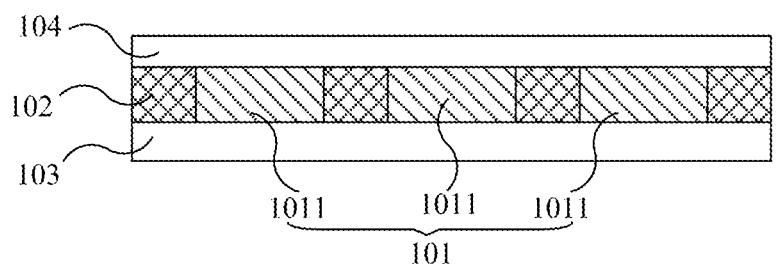
FIGS. 1A to 1E are schematic structural views illustrating a display panel according to one embodiment of the present application.
Figure 4:
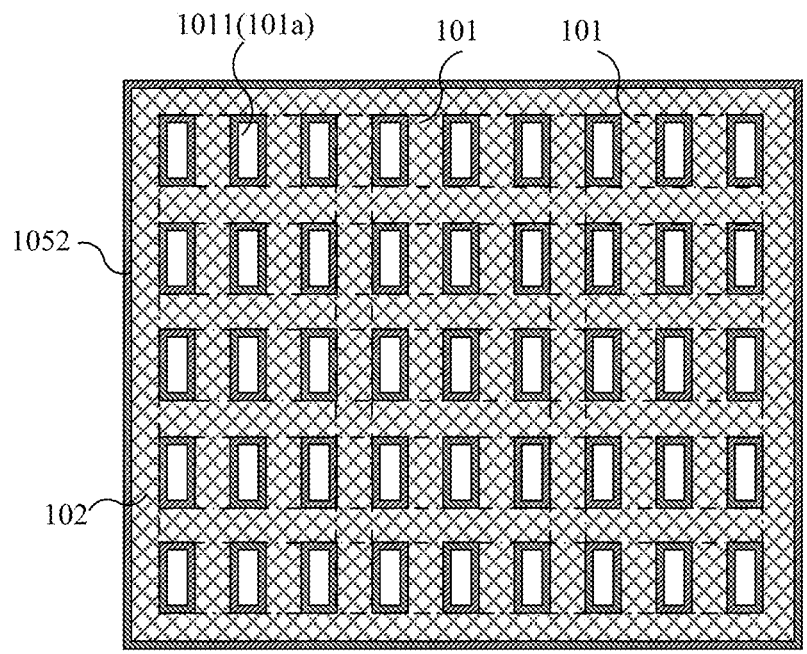
FIG. 4 is a top view illustrating the display panel shown in FIG. 1D.

Please refer to FIGS. 1A to 1E, which are schematic structural views illustrating a display panel according to one embodiment of the present application. FIGS. 2A to 2C are top views illustrating the display panel of the present application. FIG. 4 is a top view illustrating the display panel shown in FIG. 1D. The display panel comprises:
 a plurality of pixel units 101 spaced apart from each other; and
 at least one photosensor 102, wherein from a top view, each of the photosensors 102 is arranged at one side of the corresponding pixel unit 101, and the photosensors 101 are configured to convert received light energy into electrical energy. Accordingly, the present application achieves energy saving and the display panel has longer-lasting power.

Specifically, referring to FIGS. 2A to 2C, each of the pixel units 101 further comprises a plurality of sub-pixels 101a spaced apart from each other. Furthermore, from a top view, the photosensor 102 is located between two adjacent sub-pixels 101a, so that the photosensor 102 can generate the electrical energy when the sub-pixels 101a or ambient light irradiates a surface of the photosensor 102, and thereby the display panel has longer-lasting power. Further, the sub-pixel 101a further comprises sub-pixels of different colors, such as a red sub-pixel, a green sub-pixel, and a blue sub-pixel.

The photosensor 102 comprises an element for producing a photoelectric effect or a photovoltaic effect. In detail, the photosensor comprises at least one of a photodiode, a phototransistor, and a photocell.

Please refer to FIGS. 1A to 1E. The display panel further comprises an array substrate 103, each of the pixel units 101 comprises a plurality of light-emitting elements 1011 arranged on the array substrate 103, and from a top view, each of the photosensors 102 is arranged between two adjacent light-emitting elements 1011. The photosensor 102 receives light energy irradiated into the display panel from the outside and/or receives part of light energy emitted by the light-emitting elements 1011, and then converts the light energy into electrical energy, so that the display panel has longer-lasting power.

Since the photosensor 102 can convert the light energy irradiated into the display panel and part of the light energy emitted by the light-emitting elements 1011 into electrical energy, the light energy can be reused in the display panel to achieve energy saving.

Further, since the photosensor 102 can receive light signals irradiated from the outside into the display panel. Therefore, for better integration of the display panel, the photosensor 102 can also be used to realize fingerprint recognition.

Specifically, the photosensor 102 comprises a first state and a second state. When the photosensor 102 is in the first state, the photosensor 102 is configured to convert the received light energy into the electrical energy. When the photosensor 102 is in the second state, the photosensor 102 is configured to receive reflected light of a fingerprint to generate an electrical signal. The display panel further comprises a signal reading circuit configured to identify the fingerprint according to the electrical signal. The fingerprint has ridges and valleys, and there is a difference in reflectivity between the ridges and valleys, so when the photosensor 102 is in the second state, the photosensors 102 receive different light reflected off the fingerprint. As a result, the photosensors 102 generate different electrical signals, and the signal reading circuit reads the electrical signals and identifies the fingerprint based on a difference between the electrical signals. Furthermore, the photosensor 102 comprises a light-transmissive surface and a non-light-transmissive surface. To ensure accuracy of fingerprint recognition, the light-transmissive surface faces toward one side that receives the ambient light from the outside.

The light-emitting element 1011 comprises at least one of an organic light-emitting diode, a mini light-emitting diode, and a micro light-emitting diode.

The display panel further comprises an encapsulation layer 104 at one side of the light-emitting elements 1011 away from the array substrate 103, and the encapsulation layer 104 can protect the light-emitting elements 1011 from being damaged by water and oxygen.

From a top view, the photosensors 102 are arranged between the light-emitting elements 1011. In a direction perpendicular to the array substrate 103, the photosensors 102 can be disposed in gaps between the light-emitting elements 1011, as shown in FIG. 1A. Specific positions of the photosensors 102 can also be adjusted according to the structure of the display panel, as shown in FIGS. 1B to 1E.

Figure 1B:
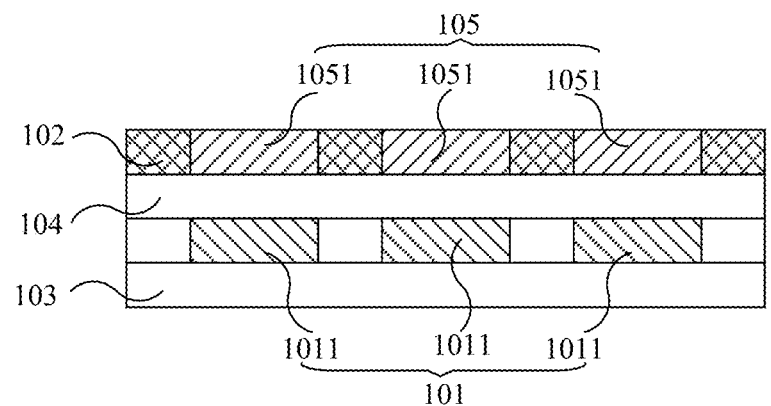
Figure 1C:
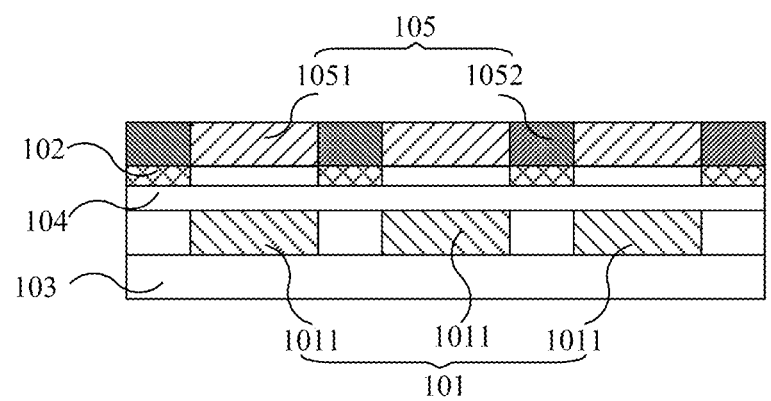
Figure 1D:
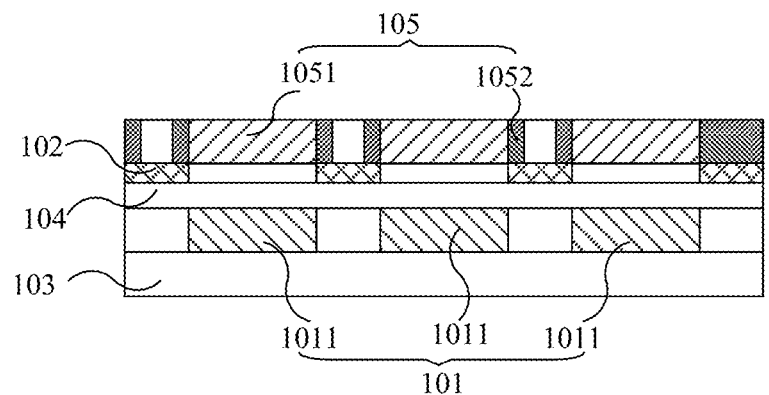
Figure 2A:
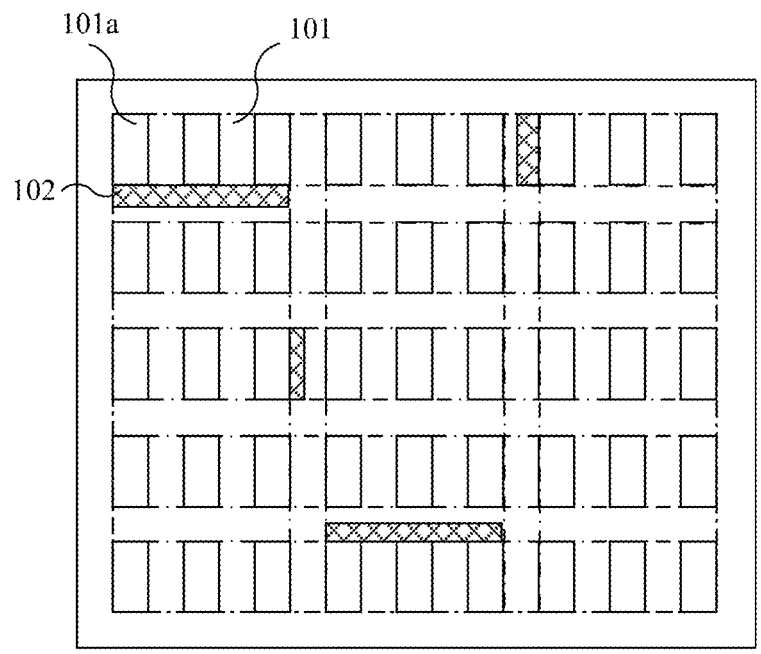
FIGS. 2A to 2C are top views illustrating the display panel of the present application.
Figure 2B:
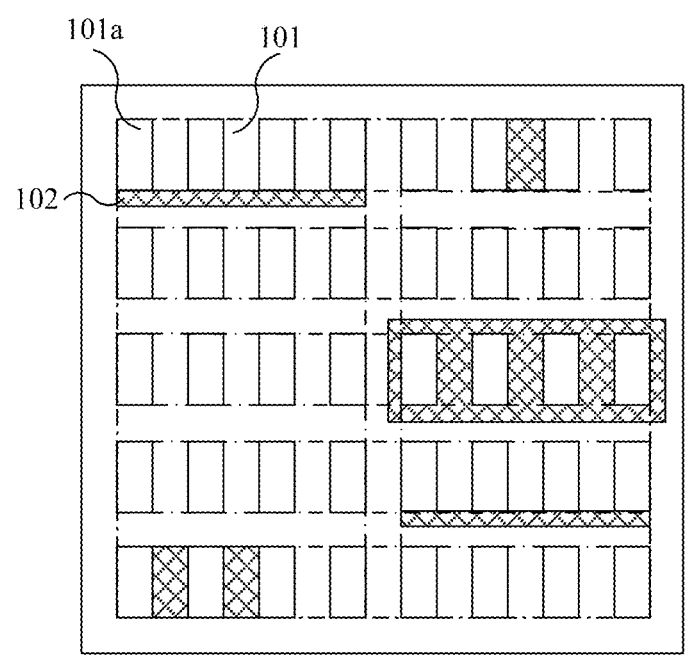
Figure 2C:
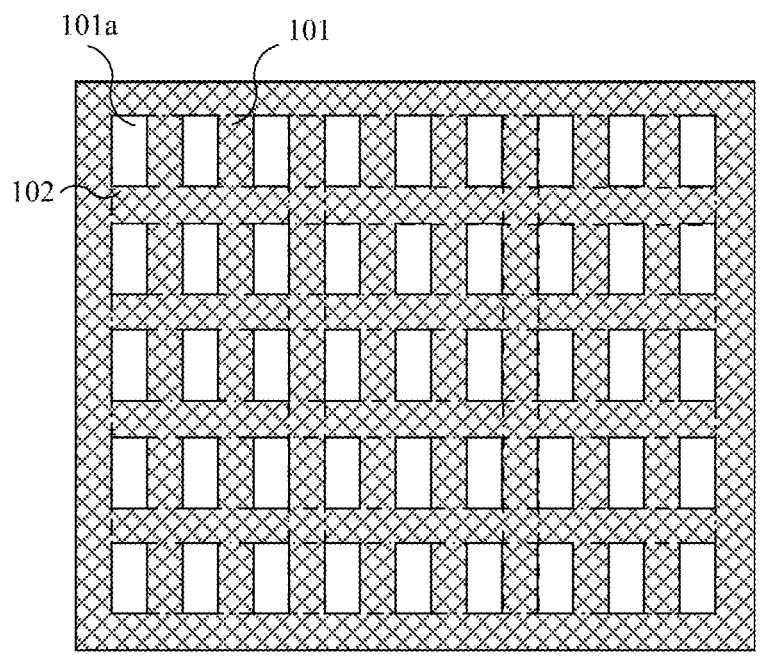

Referring to FIGS. 1B to 1D, the display panel comprises a color filter layer 105 disposed at one side of the encapsulation layer 104 away from the light-emitting elements 1011. The color filter layer 105 comprises a plurality of color filter units 1051 spaced apart from each other. The light-emitting elements 1011 are arranged corresponding to the color filter units 1051. From a top view, the photosensors 102 are arranged between the color filter units 1051.

Specifically, in a direction perpendicular to the array substrate 103, the photosensors 102 are disposed in gaps between the color filter units 1051, so that the photosensors 102 can convert the light energy of the light-emitting devices 1011 into electrical energy and can also convert external ambient light into electrical energy, or can receive light reflected off the fingerprint to generate the electrical signal, and prevent leakage of the light of the light-emitting device 101, and thereby the present application achieves energy saving or fingerprint recognition while ensuring a better contrast ratio of the display panel, as shown in FIG. 1B.

In addition, the color filter layer 105 further comprises a black matrix 1052 arranged between the color filter units 1051. In the direction perpendicular to the array substrate 103, the photosensors 102 directly face the black matrix 1052, so that the photosensors 102 less affect an aperture ratio of the display panel. Because the photosensors 102 cannot absorb all the light energy when absorbing the light energy to convert it into the electrical energy, there will be a light energy leakage, Using the black matrix 1052 can prevent further leakage of light energy, which is beneficial to improve the contrast ratio of the display panel.

The photosensor 102 can be arranged at one side of the color filter layer 105 adjacent to the light-emitting device 1011, as shown in FIG. 1C. The photosensor 102 can also be arranged at one side of the color filter layer 105 away from the light-emitting device 1011. When the photosensor 102 is arranged at one side of the color filter layer 105 adjacent to the light-emitting device 1011, a signal exchange channel between the photosensor 102 and the outside world is blocked if the black matrix 1052 completely covers the photosensor 102, as shown in FIG. 1C, which is not conducive to fingerprint recognition. The photosensor 102 only receives the light energy emitted by the light-emitting device 1011 and converts it into electrical energy.

Furthermore, the photosensors 102 are arranged over the black matrix 1052, or the photosensors 102 are arranged below the black matrix 1052. A plurality of via holes are defined in the black matrix 1052 to expose the photosensors 102, as shown in FIG. 1D. thereby increasing conversion from ambient light into the light energy of the photosensors 102, or facilitating the photosensors 102 to receive the reflected light from the fingerprint, so that the display panel can realize fingerprint recognition, as shown in FIG. 1D. FIG. 4 is a top view of the display panel shown in FIG. 1D.

The light emitted by the light-emitting devices 1011 may be monochromatic light, and the corresponding color filter layer 105 includes the color filter units 1051 having different colors to realize the full-color display of the display panel. Furthermore, the light emitted by the light-emitting device 1011 is white light, and the color filter units 1051 comprise a red color filter unit, a green color filter unit, and a blue color filter unit.

The light emitted by the light-emitting devices 1011 can be multi-color light. The color filter unit 1051 of the color filter layer 105 emit the same color light as the light emitted by the correspondingly arranged light-emitting device 1011. That is, if the light-emitting devices 1011 comprises a red light-emitting device, a green light-emitting device, a blue light-emitting device, and so forth, then the color filter unit 1051 comprises a red color filter unit, a green color filter unit, a blue color filter unit, and so forth. The red color filter unit is arranged corresponding to the red light-emitting device. The green color filter unit is arranged corresponding to the green light-emitting device, and the blue color filter unit is arranged corresponding to the blue light-emitting device.

The display panel with the color filter layer 105 of the present application can omit a circular polarizer to reduce the reflection of ambient light, and the color filter layer 105 has better flexibility, which is beneficial for the display panel to be foldable.

Figure 1E:
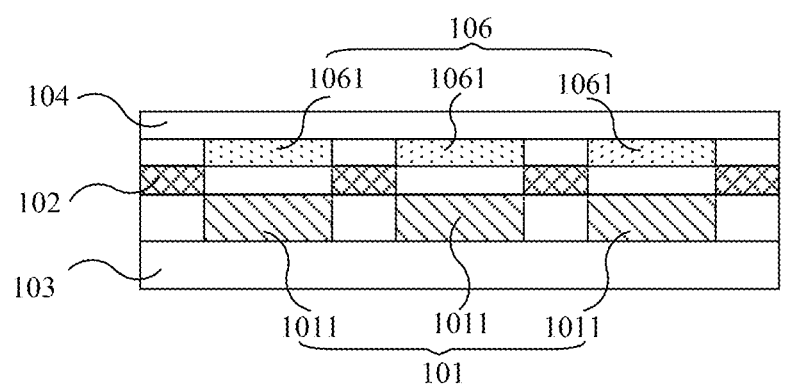

Please refer to FIG. 1E. The display panel comprises the light-emitting device 1011, the array substrate 103, the encapsulation layer 104, and the photosensors 102. The display panel further comprises a color conversion film 106 arranged at one side of the light-emitting devices 1011 away from the array substrate 103, the color conversion film 106 comprises a plurality of color conversion units 1061 arranged corresponding to the light-emitting devices 1011. From a top view, the photosensors 102 are arranged between the color conversion units 1061. In the direction perpendicular to the array substrate 103, the photosensors 102 can be disposed in the gaps between the light-emitting devices 1011, or can be disposed in gaps between the color conversion units 1061, or can be disposed between the light-emitting devices 1011 and the color conversion film 106, as shown in FIG. 1E. Alternatively, the photosensors 102 can also be arranged at one side of the color conversion film 106 away from the light-emitting devices 1011.

The color conversion unit 1061 includes a first color conversion unit and a second color conversion unit. The first color conversion unit is configured to convert the light having the first wavelength emitted by the light-emitting device 1011 into the light having the second wavelength. The second color conversion unit is configured to transmit the light of the light-emitting device 1011.

Specifically, if the light-emitting device 1011 is a blue light-emitting device, each of the first color conversion units in the color conversion film 106 absorbs blue light emitted by the light-emitting device 1011 and converts it into red light, yellow light, and green light. The second color conversion unit transmits the blue light emitted by the light-emitting device 1011. The color conversion unit 1061 is made of a fluorescent material, a quantum dot material, or a perovskite material.

Please refer to FIGS. 1A to 1E. The array substrate 103 also includes a base substrate and a thin film transistor (TFT) on the base substrate, which are not shown in the drawings. From a top view, the photosensor 102 can cover the TFT or not; configurations may vary according to actual needs.

Please refer to FIGS. 3A to 3I, which are schematic structural views illustrating the display panel according to the present application. The display panel shown in FIGS. 3A to 3I is different from the display panel shown in FIGS. 1A to 1E in that the pixel unit 101 of the display panel shown in FIGS. 3A to 3I is a liquid crystal display unit. In detail, the display panel further comprises: a color filter substrate 301; an array substrate 303 arranged corresponding to the color filter substrate 301 and located below the color filter substrate; a liquid crystal layer 304 arranged between the color filter substrate 301 and the array substrate 303; and a backlight module 302 arranged at one side of the array substrate 303 away from the color filter substrate 301. The photosensors 102 are arranged on one side of the color filter substrate 301 and/or on one side of the array substrate 303.

Figure 3A:
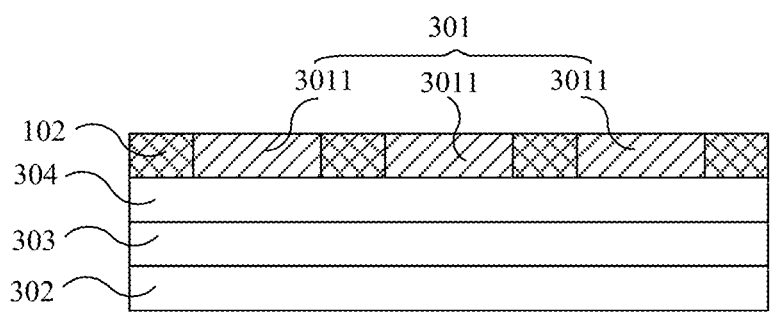
FIGS. 3A to 3I are schematic structural views illustrating the display panel of the present application.

Specifically, the color filter substrate 301 comprises a plurality of color filter units 3011 spaced apart from each other, and each of the pixel units comprises a corresponding color filter unit 3011. From a top view, the photosensors 102 are arranged between the color filter units 3011. In the direction perpendicular to the color filter substrate 301, the photosensors 102 can be disposed in gaps between the color filter units 3011, as shown in FIG. 3A, so that the photosensor 102 prevents light emitted by the backlight module 302 from leakage when light energy is converted into electrical energy, and thus the display panel has a better contrast ratio.

Furthermore, since the photosensors 102 can receive light signals irradiated from the outside into the display panel, the photosensors 102 are also utilized to realize fingerprint recognition. Specifically, the photosensor 102 has a first state and a second state. When the photosensor 102 is in the first state, the photosensor 102 is configured to convert the received light energy into the electrical energy. When the photosensor 102 is in the second state, the photosensors 102 are configured to receive the reflected light of the fingerprint to generate electrical signals, and the signal reading circuit reads the electrical signals, thereby realizing fingerprint recognition.

Please refer to FIGS. 3B to 3I. The display panel further comprises a black matrix 3012. From a top view, the black matrix 3012 is arranged between the color filter units 3011, and the photosensors 102 are arranged to face the black matrix 3012 to improve the contrast ratio of the display panel.

Figure 3B:
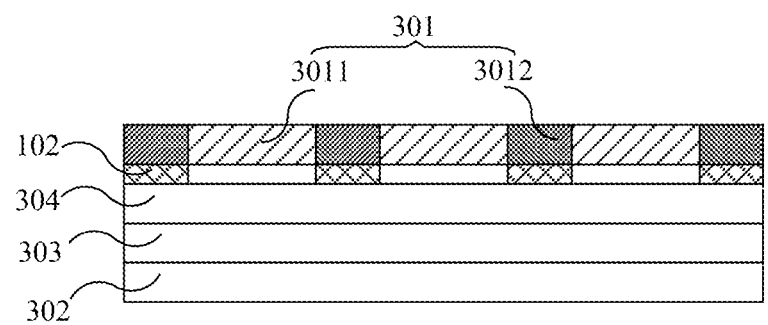
Figure 3C:
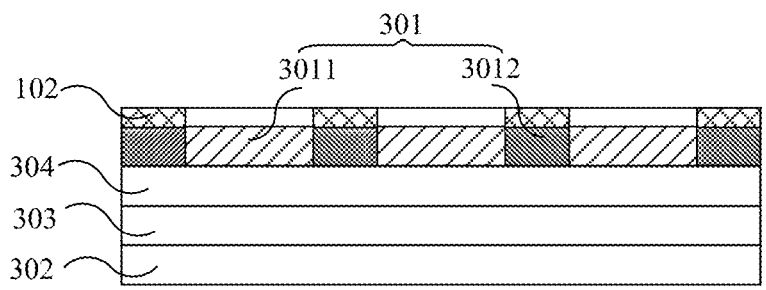
Figure 3D:
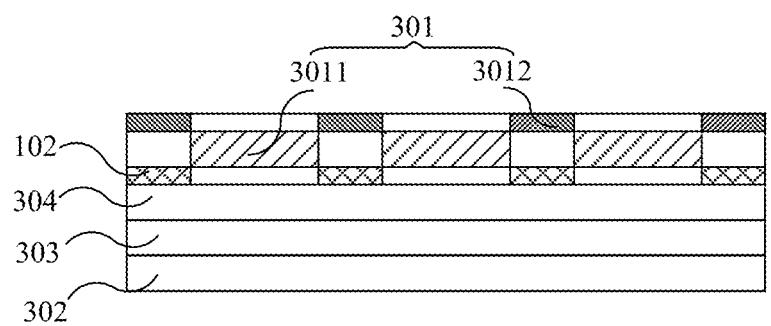
Figure 3E:
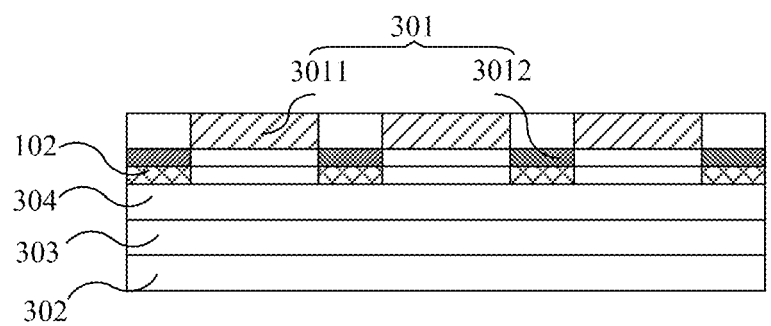

Specifically, the photosensors 102 can be arranged at one side of the black matrix 3012 adjacent to the array substrate 303, and the photosensors 102 can also be arranged at one side of the black matrix 3012 away from the array substrate 303. When the photosensors 102 are arranged at one side of the black matrix 3012 adjacent to the array substrate 303, a signal exchange channel between the photosensors 102 and the outside world is blocked if the black matrix 1052 completely covers the photosensors 102, as shown in FIG. 3B and FIGS. 3D to 3E, which is not conducive to fingerprint recognition. The photosensor 102 only receives the light energy emitted by the backlight module 302 and converts it into electrical energy.

In order to realize fingerprint recognition while the photosensors 102 realize the conversion of light energy into electric energy, the photosensors 102 can be arranged at one side of the black matrix 3012 away from the array substrate 303. In detail, the photosensors 102 is arranged over the black matrix 3012, as shown in FIG. 3C, in order to receive the reflected light of the fingerprint and realize fingerprint recognition. Furthermore, the photosensors 102 can also be arranged below the black matrix 3012, and via holes are defined in the black matrix 3012 to expose the photosensors 102, so that the photosensors 102 can receive ambient light from the outside or receive the reflected light of the fingerprint to realize the conversion of light energy into electrical energy or realize fingerprint recognition, as shown in FIGS. 3F to 3H.

Figure 3F:
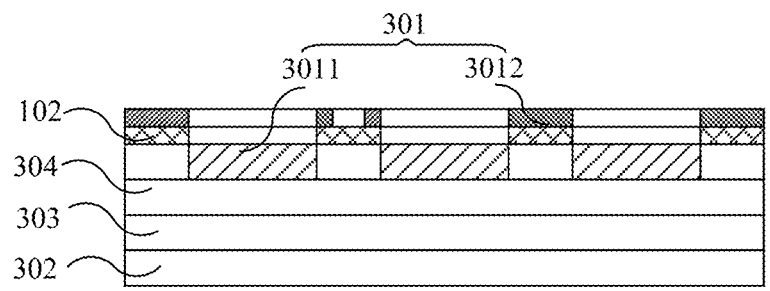
Figure 3G:
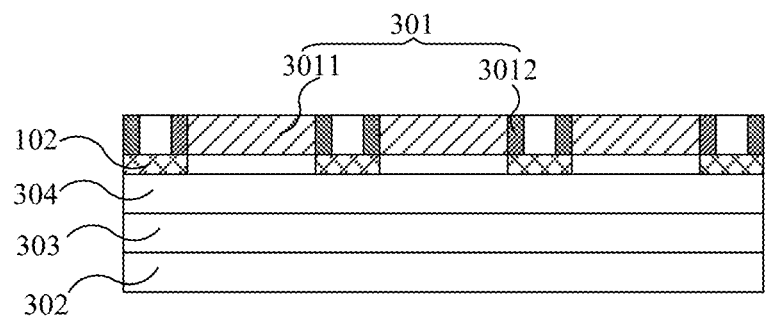

The black matrix 3012 can be arranged over the color filter units 3011, as shown in FIGS. 3D and 3F. The black matrix 3012 can also be arranged in the gaps between the color filter units 3011, as shown in FIGS. 3B to 3C and FIGS. 3G to 3I. The black matrix 3012 is arranged below the color filter units 3011, as shown in FIG. 3E.

In addition, the photosensors 102 can also be disposed on one side of the array substrate 303 to facilitate collecting the electrical energy converted by the photosensors 102, and also reduce the difficulty in the manufacturing process and the production costs to a certain extent. That is, in the display panel as shown in FIG. 3I, the photosensors 102 are arranged on areas of the array substrate 303 corresponding to the black matrix 3012.

Figure 3H:
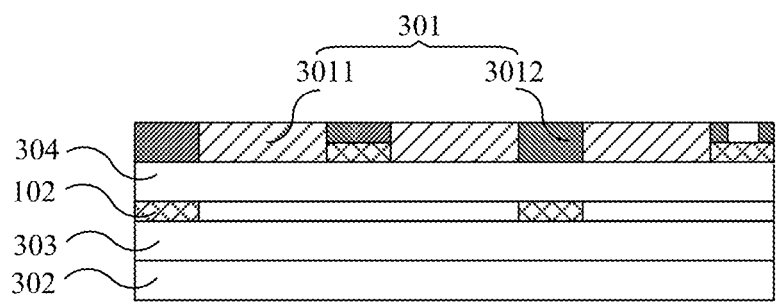
Figure 3I:
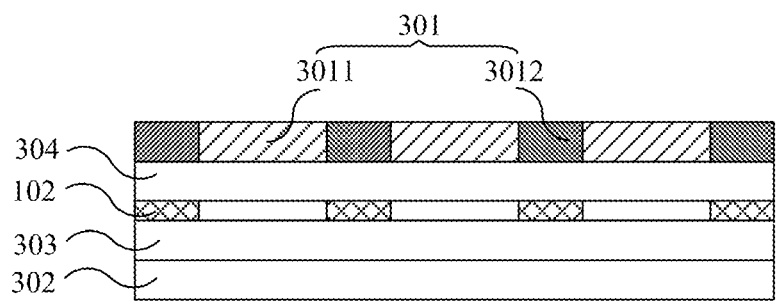

In addition, the photosensors 102 can be arranged in different layers, as shown in FIG. 3H. That is to say, the photosensors 102 are arranged on one side of the color filter substrate 301 and one side of the array substrate 303.

Please refer to FIGS. 3A to 3I. The array substrate 303 also comprises: a base substrate; thin film transistors (TFTs), pixel electrodes, and a first alignment layer on the base substrate, which are not illustrated. The color filter substrate 301 also comprises a common electrode, a second alignment layer, and so forth, which are not illustrated.

In the display panel shown in FIGS. 3A to 3I, the color filter units 3011 is arranged on one side of the color filter substrate 301; those skilled in the art can also arrange the color filter units 3011 on the side of the array substrate 303. When the color filter units 3011 are disposed on the side of the array substrate 303, then from a top view, the photosensors 102 are arranged between the color filter units 3011, and in a direction perpendicular to the array substrate 303, the photosensors 102 can be disposed in the gaps between the color filter units 3011; configurations can be adjusted according to the structure of the display panel, and a detailed description thereof is not provided herein.

Figure 5A:
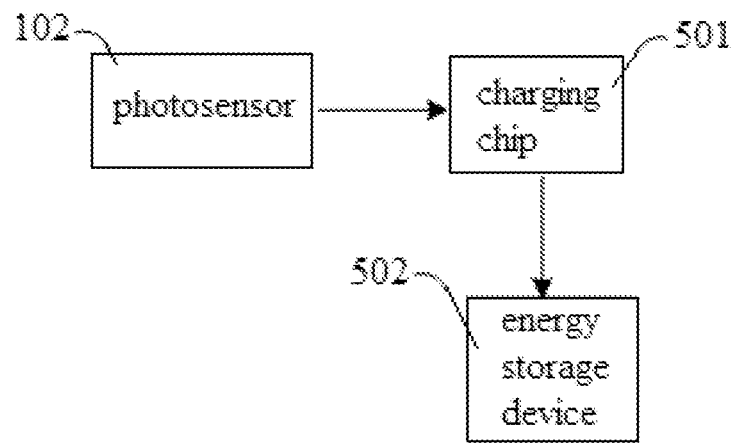
FIGS. 5A to 5C are schematic diagrams illustrating an electrical energy collection circuit of the present application.
Figure 5B:
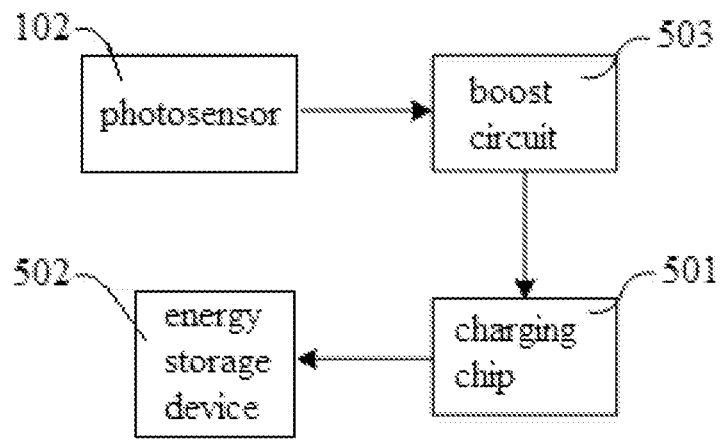
Figure 5C:
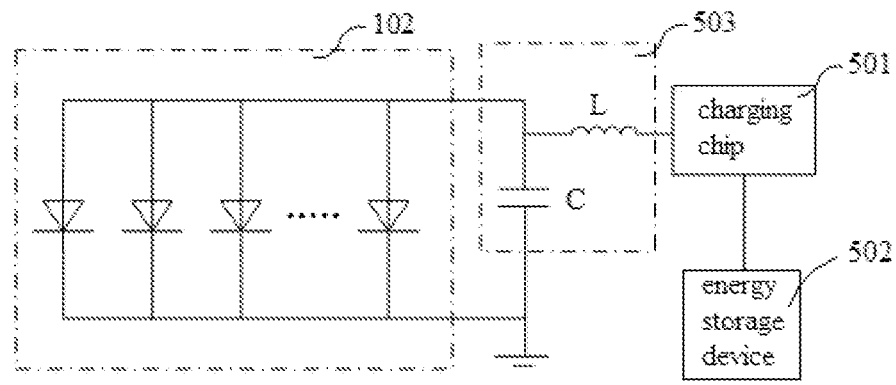

Please refer to FIGS. 5A to 5C, which are schematic diagrams illustrating an electrical energy collection circuit according to the present application. The display panel further comprises the electrical energy collection circuit electrically connected to the at least one photosensor 102 for storing the electrical energy, so that the display panel can use the electrical energy when needed.

Specifically, the electrical energy collection circuit further comprises:
a charging chip 501 electrically connected to the photosensors 102; and
an energy storage device 502, wherein the photosensor 102 charges the energy storage device 502 through the charging chip 501.

Specifically, when the photosensor 102 is in the first state, the photosensor 102 converts the received light energy into electrical energy, the charging chip 501 in the electrical energy collection circuit is used to collect the electrical energy converted by the photosensor 102, and the collected electrical energy is stored by the energy storage device 502, so that the electrical energy can be used by the display panel, and as a result, and the display panel has longer-lasting power.

The charging chip 102 can be electrically connected to the photosensor 102 by using a flip chip film or the like. If the display panel already has a charging chip, this charging chip can be used to collect the electrical energy converted by the photosensor 102. In addition, in order to prevent normal operations of the display panel from being affected by sharing the same one charging chip, another charging chip can be added, and the added charging chip is used to collect the electrical energy converted by the photosensors 102.

The electrical energy required by the charging chip 501 during operation needs to be less than the electrical energy generated by the photosensor 102, so as to avoid that the charging chip 501 consumes too much power, which results in that the electrical energy generated by the photosensor 102 is not consumed by the display panel, but instead, only consumed by the charging chip 501 to cause an increase in the power consumption of the display panel. In actual production, a type of the charging chip 501 needs to be selected according to a type and parameters of the display panel, and a detailed description is not provided herein for brevity.

The energy storage device 502 comprises a battery, and the energy storage device 502 can be the original energy storage device of the display panel to reduce production costs of the display panel.

Please refer to FIGS. 5B to 5C, the electrical energy collection circuit further comprises a boost circuit 503 arranged between the photosensors 102 and the charging chip 501, so that the electrical energy converted by the photosensor 102 is first boosted to a same voltage level, and then the charging chip 501 is used to charge the energy storage device 502, so as to avoid that the electrical energy obtained by conversion among the multiple photosensors 102 have differences in the voltage level, current value, or other parameters to cause damage to the charging chip 501 and the energy storage device 502.

Furthermore, the boost circuit 503 comprises at least one capacitor C and an inductor L. The photosensors 102 are connected in parallel with the capacitor C. One end of the inductor L is connected to the capacitor C. The other end of the inductor L is electrically connected to the charging chip 501.

Specifically, taking as an example that the photosensor 102 is a photodiode, each photosensor 102 has an anode and a cathode, anodes of the photosensors 102 are connected to one end of the capacitor C, and cathodes of the photosensor 102 are connected to the other end of the capacitor C and grounded, one end of the inductor L is connected to one end of the capacitor C, which is connected to the anode of the photosensor 102, and the other end of the inductor L is electrically connected to the charging chip, as shown in FIG. 5C.

Figure 6A:
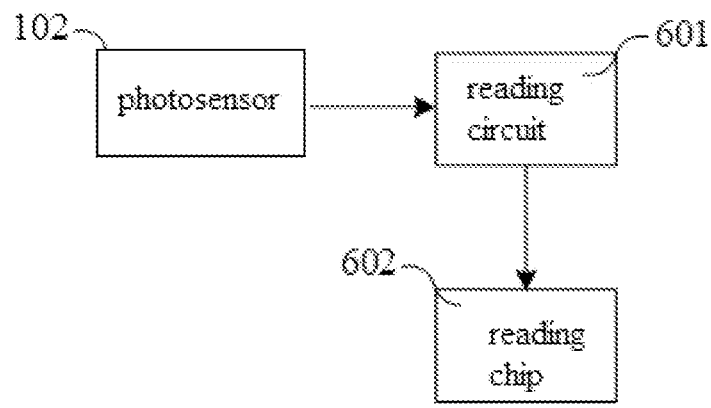
FIGS. 6A and 6B are schematic diagrams illustrating a signal reading circuit of the present application.
Figure 6B:
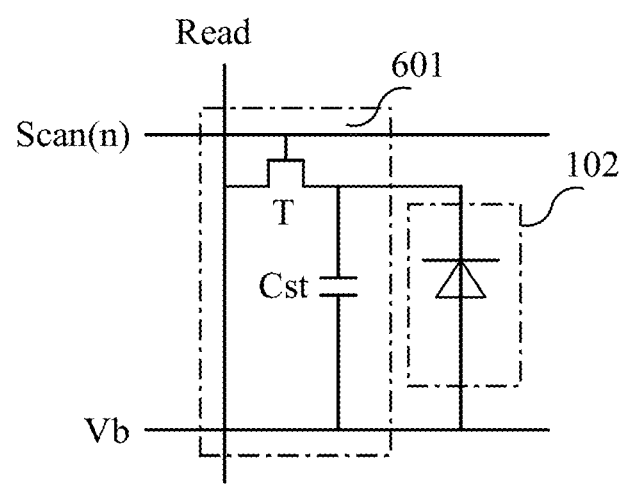

Please refer to FIGS. 6A and 6B, which are schematic diagrams illustrating the signal reading circuit according to the present application, and the signal reading circuit further comprises:

a plurality of reading circuits 601 configured to read the electrical signals; and a reading chip 602 electrically connected to the reading circuits 601, wherein the reading chip 602 is configured to identify the fingerprint according to the difference between the electrical signals.

Specifically, when the photosensor 102 is in the second state, the photosensors 102 respectively generate different electrical signals according to the difference in the reflected light between ridges and valleys of the fingerprint, the reading circuit 601 reads the electrical signals, and the electrical signals are fed back to the reading chip 602. The reading chip 602 judges the electrical signals and identifies the ridges and valleys of the fingerprint based on the difference between the electrical signals, thus achieving fingerprint recognition. The electrical signals generated by the photosensors 102 according to the difference in reflected light between the ridges and valleys of the fingerprint are currents.

Please refer to FIG. 6B. Each of the reading circuits 601 further comprises:

a storage capacitor Cst connected in parallel with the photosensor 102, and a first terminal of the storage capacitor Cst is configured to receive a bias signal Vb; and a transistor T, wherein a gate of the transistor T is connected to a scan signal line Scan(n), a first terminal of the transistor T is connected to a reading signal line Read, and a second terminal of the transistor T is connected to a second terminal of the storage capacitor Cst.

Specifically, taking as an example that the photosensor 102 is a photodiode, each photosensor 102 has an anode and a cathode, the anode is connected to the first terminal of the storage capacitor Cst, and the cathode is connected to the second terminal of the storage capacitor Cst, as shown in FIG. 6B.

The display panel has the reading circuits 601. The reading circuits 601 are arranged in an array, and each of the reading circuits 601 is arranged corresponding to one of the photosensors 102, so that each photosensor 102 generates the electrical signal. When the photosensors 102 are used for fingerprint recognition, the photosensors 102 receive different reflected light from the ridges and valleys of the fingerprint, and generate different electrical signals, and each electrical signal is stored in the storage capacitor Cst of the corresponding reading circuit 601. When a scan signal loaded in the scan signal line Scan(n) of the reading circuit 601 is valid, the transistor T is turned on, and the storage capacitor Cst releases the stored electrical signal to the reading chip 602 through the reading signal line Read. The reading chip 602 judges the electrical signals received at the same time, and the fingerprint is identified based on the difference between the received electrical signals.

The transistor T is a field effect transistor. Furthermore, the transistor T is a thin film transistor, the first terminal of the transistor T is one of a source and a drain, and the second terminal of the transistor T is the other one of the source and the drain.

The display panel can realize the switching between the first state and the second state of the photosensor 102 in a time sequence control manner, so that the electrical energy collection circuit or the signal reading circuit can work at different times. Accordingly, the photosensor 102 can work in a working state where light energy is converted into electrical energy, or in a working state where fingerprint recognition is performed. In addition, the switching between the first state and the second state of the photosensor 102 can also be realized by means of a conversion circuit. In detail, the conversion circuit is a controllable switch, and the controllable switch turns on the electrical energy collection circuit or the signal reading circuit according to a given signal to switch the photosensor 102 to operate in the working state for converting light energy into electric energy or operate in the working state for fingerprint recognition. The given signal can be provided by a control chip of the display panel; however, configuration may vary according to actual requirements, and a detailed description thereof is omitted herein for brevity.

The signal reading circuit shown in FIG. 6B is described by taking as an example that the transistor T is an N-type transistor. However, those skilled in the art can also use a P-type transistor instead to realize the signal reading circuit, and a detailed description thereof is omitted for brevity.

The present application also provides a display device which comprises the display panel. Specifically, the display panel comprises a mobile terminal device and a non-mobile terminal device. Further, the mobile terminal device comprises a mobile phone, a watch, a notebook computer, a bracelet with a display screen, and etc. The non-mobile terminal comprises a television, a desktop computer, and other equipment.

The display device can further include a touch panel, and the touch panel can be combined with the display panel in an external or built-in form.

The present application provides the display panel and the display device of the present application. The display panel comprises a plurality of pixel units 101 spaced apart from each other and at least one photosensor 102. From a top view, each photosensor 102 is arranged at one side of the corresponding pixel unit 101. The photosensor 102 is configured to convert the received light energy into electrical energy, thus achieving energy saving and providing longer-lasting power for the display panel.

In the above-mentioned embodiments, the description of each embodiment has its own emphasis. For some details that are not described in one embodiment, reference may be made to related descriptions of other embodiments.

The display panel and display device provided by the present application are described in detail above. Specific examples are used to describe the working principles and embodiments of the present application. The descriptions of the above embodiments are only used for ease of understanding of the technical solution and the main ideas of the present application. Those of ordinary skill in the art should be able to modify the technical solutions in the foregoing embodiments, or equivalently replace some of the technical features. Such modifications or replacements should be deemed to be within the protection scope of the present application.

What is claimed is:

1. A display panel, comprising:
    a plurality of pixel units spaced apart from each other, each of the pixel units comprising a plurality of subpixels spaced apart from each other; and
    a plurality of photosensors, wherein from a top view, each of the photosensors is arranged at one side of the corresponding pixel unit, and the photosensors are configured to convert received light energy from an external environment and the pixel units into electrical energy;
    wherein each of the photosensors comprises a first state and a second state; in the first state, each of the photosensors is configured to convert the received light energy from an external environment and the pixel units into the electrical energy; in the second state, each of the photosensors is configured to receive reflected light of a fingerprint to generate an electrical signal; and the display panel further comprises a signal reading circuit, and the signal reading circuit is configured to identify the fingerprint according to the electrical signals of the photosensors;
    wherein the display panel further comprises an electrical energy collection circuit electrically connected to at least one of the photosensors for storing the electrical energy, and the electrical energy collection circuit comprises:
    a charging chip electrically connected to the photosensor; and
    an energy storage device, wherein the photosensor charges the energy storage device through the charging chip.

2. The display panel according to claim 1, wherein the display panel further comprises an array substrate, each of the pixel units comprises a plurality of light-emitting elements arranged on the array substrate, and from a top view, each of the photosensors is arranged between two adjacent light-emitting elements.

3. The display panel according to claim 2, wherein the light-emitting element comprises at least one of an organic light-emitting diode, a mini light-emitting diode, and a micro light-emitting diode.

4. The display panel according to claim 1, wherein the display panel further comprises a plurality of color filters spaced apart from each other, and from a top view, the photosensors are arranged between the color filters.

5. The display panel according to claim 4, wherein the display panel further comprises a black matrix; from a top view, the black matrix is arranged between the color filters; and the photosensors face toward the black matrix.

6. The display panel according to claim 5, wherein the black matrix is disposed over the color filters, or the black matrix is arranged in gaps between the color filters, or the black matrix is arranged below the color filters.

7. The display panel according to claim 5, wherein the photosensors are arranged under the black matrix, and a plurality of via holes are defined in the black matrix to expose the photosensors.

8. The display panel according to claim 5, wherein the display panel further comprises an array substrate, and the photosensors are arranged in areas of the array substrate corresponding to the black matrix.

9. The display panel according to claim 4, wherein the pixel units are liquid crystal display units, the display panel further comprises a color filter substrate, the color filters spaced apart from each other are disposed on the color filter substrate, and each of the pixel units comprises a corresponding one of the color filters.

10. The display panel according to claim 4, wherein the display panel further comprises an array substrate, each of the pixel units comprises a plurality of light-emitting elements arranged on the array substrate, and the color filters are disposed corresponding to the light-emitting elements.

11. The display panel according to claim 1, wherein the photosensor comprises an element for producing a photoelectric effect or a photovoltaic effect.

12. The display panel according to claim 11, wherein the photosensor comprises at least one of a photodiode, a phototransistor, and a photocell.

13. The display panel according to claim 1, wherein the electrical energy collection circuit further comprises a boost circuit arranged between the photosensors and the charging chip.

14. The display panel according to claim 13, wherein the boost circuit comprises at least one capacitor and an inductor, the photosensors are connected in parallel with the at least one capacitor, one end of the inductor is connected to the at least one capacitor, and the other end of the inductor is electrically connected to the charging chip.

15. The display panel according to claim 1, wherein the signal reading circuit comprises:
    a plurality of reading circuits configured to read the electrical signals;
    a reading chip electrically connected to the reading circuits, wherein the reading chips is configured to identify the fingerprint according to a difference between the electrical signals.

16. The display panel according to claim 15, wherein each of the reading circuits comprises:
    a storage capacitor, wherein the storage capacitor is connected in parallel with the photosensor, and a first terminal of the storage capacitor is configured to receive a bias signal; and
    a transistor, wherein a gate of the transistor is connected to a scan signal line, a first terminal of the transistor is connected to a reading signal line, and a second terminal of the transistor is connected to a second terminal of the storage capacitor.

17. A display device, comprising a display panel, wherein the display panel comprises:

a plurality of pixel units spaced apart from each other, each of the pixel units comprising a plurality of sub-pixels spaced apart from each other; and a plurality of photosensors, wherein from a top view, each of the photosensors is arranged at one side of the corresponding pixel unit, and the photosensors are configured to convert received light energy from an external environment and the pixel units into electrical energy;

wherein each of the photosensors comprises a first state and a second state; in the first state, each of the photosensors is configured to convert the received light energy from an external environment and the pixel units into the electrical energy; in the second state, each of the photosensors is configured to receive reflected light of a fingerprint to generate an electrical signal; and the display panel further comprises a signal reading circuit, and the signal reading circuit is configured to identify the fingerprint according to the electrical signals of the photosensors, wherein the display panel further comprises an electrical energy collection circuit electrically connected to at least one of the photosensors for storing the electrical energy, and the electrical energy collection circuit comprises:

a charging chip electrically connected to the photosensor; and an energy storage device, wherein the photosensor charges the energy storage device through the charging chip.

\* \* \* \* \*